United States Patent [19]

Ashida et al.

[11] Patent Number: 4,947,232
[45] Date of Patent: Aug. 7, 1990

[54] HIGH VOLTAGE MOS TRANSISTOR

[75] Inventors: Tsutomu Ashida, Yamatokoriyama; Kiyotoshi Nakagawa, Nara; Katsumasa Fujii, Nara; Yasuo Torimaru, Nara, all of Japan

[73] Assignee: Sharp Kabushiki Kaisha, Osaka, Japan

[21] Appl. No.: 277,440

[22] Filed: Nov. 28, 1988

Related U.S. Application Data

[63] Continuation of Ser. No. 41,653, Apr. 21, 1987, abandoned, which is a continuation of Ser. No. 801,870, Nov. 26, 1985, abandoned, which is a continuation of Ser. No. 532,089, Sep. 14, 1983, abandoned, which is a continuation of Ser. No. 246,062, Mar. 20, 1981, abandoned.

[30] Foreign Application Priority Data

Mar. 22, 1980 [JP] Japan .................................. 55-37702
Mar. 22, 1980 [JP] Japan .................................. 55-37703

[51] Int. Cl.⁵ ............................................ H01L 29/78
[52] U.S. Cl. ...................................... 357/53; 357/23.8; 357/41
[58] Field of Search ..................... 357/23.8, 53, 23.4

[56] References Cited

U.S. PATENT DOCUMENTS

| | | | |
|---|---|---|---|
| T964,009 | 11/1977 | Chiu et al. | 357/53 |
| 3,841,926 | 10/1974 | Garnache et al. | 357/53 |
| 3,890,698 | 6/1975 | Clark | 357/53 |
| 3,967,310 | 6/1976 | Horiuchi et al. | 357/54 |
| 4,009,483 | 2/1977 | Clark | 357/53 |
| 4,079,504 | 3/1978 | Kosa | 29/571 |
| 4,157,563 | 6/1979 | Bosselaar | 357/53 |
| 4,172,260 | 10/1979 | Okabe et al. | 357/23.8 |
| 4,194,214 | 3/1980 | Awane et al. | 357/23.4 |
| 4,199,774 | 4/1980 | Plummer | 357/23 VD |
| 4,270,137 | 5/1981 | Coe | 357/53 |
| 4,288,803 | 9/1981 | Ronen | 357/41 |
| 4,290,077 | 9/1981 | Ronen | 357/41 |
| 4,290,078 | 9/1981 | Ronen | 357/23.4 |
| 4,292,729 | 10/1981 | Powell | 29/571 |
| 4,394,674 | 7/1983 | Sakuma et al. | 357/23 HV |
| 4,614,959 | 9/1986 | Nakagawa | 357/53 |

FOREIGN PATENT DOCUMENTS

| | | | |
|---|---|---|---|
| 963174 | 2/1975 | Canada | 357/53 |
| 2031082 | 4/1971 | Fed. Rep. of Germany | 357/53 |
| 53-27374 | 3/1978 | Japan | 357/23.8 |
| 53-66181 | 6/1978 | Japan | 357/23.4 |
| 54-37584 | 3/1979 | Japan | 357/53 |
| 300472 | 4/1968 | Sweden | 357/53 |

OTHER PUBLICATIONS

"CMOS Voltages Range to 150-200 V," Electronics, vol. 49, #21, pp. 40, 42, Oct. 14, 1976.
I. Yoshida et al., "Thermal Stability & Sec. Bkdown Inplanar Power MOSFETS," IEEE Trans. on Elec. Dev., vol. Ed-27 #2, Feb. 1980, pp. 395-398.

Primary Examiner—Rolf Hille
Assistant Examiner—Peter Toby Brown
Attorney, Agent, or Firm—Birch, Stewart, Kolasch & Birch

[57] ABSTRACT

A metal oxide semiconductor device is featured by the provision of a covering element for covering a channel region of the semiconductor device there being interposed therebetween an insulating layer. The covering element is connected to at least one electrode selected from the drain electrode, the source electrode and the gate electrode. Therefore, the electrical level of the covering element is fixed.

3 Claims, 4 Drawing Sheets

HIGH VOLTAGE MOS TRANSISTOR

This application is a continuation of application Ser. No. 041,653 filed Apr. 21, 1987, which is a continuation of application Ser. No. 801,870 filed Nov. 26, 1985, which is a continuation of application Ser. No. 532,089 filed Sep. 14, 1983, which is a continuation of application Ser. No. 246,062 filed Feb. 20, 1981, all now abandoned.

BACKGROUND OF THE INVENTION

The present invention relates to a metal oxide semiconductor (MOS) transistor and, more particularly, to a high voltage MOS transistor.

To establish an improved high voltage MOS transistor by preventing field concentration near the edge of a gate electrode, an attempt has been made in which there has been additionally provided a high resistant layer adjacent a drain as a part of the drain region, the conductivity type of the high resistant layer being the same as the drain.

The conventional transistor comprises a P type substrate, N+ type source layer, an N+ type drain layer, a P+ layer, an N− type high resistant layer, a source electrode, a drain electrode, insulating layers 8, 8' and 8'', a gate electrode, field plate layers, and an additional field plate layer made of Al, polycrystalline silicon, or the like.

The P+ type layer surrounds the N+ type source layer for providing a gate channel for the transistor. The layer is formed by the diffusion-self-alignment process. A high voltage diffusion-self-alignment MOS transistor is described in Awane et al U.S. Pat. No. 4,058,822 issued Nov. 15, 1977, assigned to the present assignee, entitled "HIGH VOLTAGE, LOW ON-RESISTANCE DIFFUSION-SELF-ALIGNMENT METAL OXIDE SEMICONDUCTOR DEVICE AND MANUFACTURE THEREOF". The disclosure of this patent is incorporated herein by reference.

Around the N+ type drain layer, the N− type high resistant layer is provided for preventing field concentration in the edge of the N− type high resistant gate electrode. The layer constitutes a part of the drain region. Each of the source electrode and the drain electrode is composed of Al, polycrystalline silicon, or the like. Each of the field plate layers extends from each of the source electrode and the drain electrode. The gate electrode is made of Al or polycrystalline silicon, called a silicon gate. The field plate layer is prepared simultaneously with the preparation of the silicon gate.

The field plate layer functions to reduce field concentration in the edges of the gate electrode and in the boundary between the N+ type layer and the N− type layer.

If one of the field plate layers extends over an acceptable limitation, a reverse field plate effect may be generated which is applied to the drain portion by the layer or to the edge of the gate electrode by the layer. This reduces the value of a sustained voltage.

To eliminate the generation of the reverse field plate effect, the above-mentioned structure of the transistor includes a region A of the N− type high resistant layer not covered by the field plate layers, made of Al or the polycrystalline silicon. Undesirably, the amount of a sustainable voltage in the ON condition, the amount of the drain current and the value of $R_{ON}$ will inevitably vary according to this structure.

SUMMARY OF THE INVENTION

In view of the foregoing, it is an object of the present invention to provide an improved high voltage MOS transistor for eliminating the above-stated disadvantages.

It is another object of the present invention to provide an improved high voltage MOS transistor comprising a high resistant channel portion adjacent a drain region, the high resistant portion being substantially and completely covered by an insulating layer to thereby prevent adverse effects by externally applied charges, referred as a field plate effect.

Briefly described, a MOS transistor of the present invention is featured by providing a high resistance covering element for covering a channel region of the semiconductor device. The covering element has interposed therebetween an insulating layer. The covering element is connected to at least one electrode selected from the drain electrode, the source electrode and the gate electrode. Therefore, the electrical level of the covering element is fixed.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE INVENTION

Figure 1:
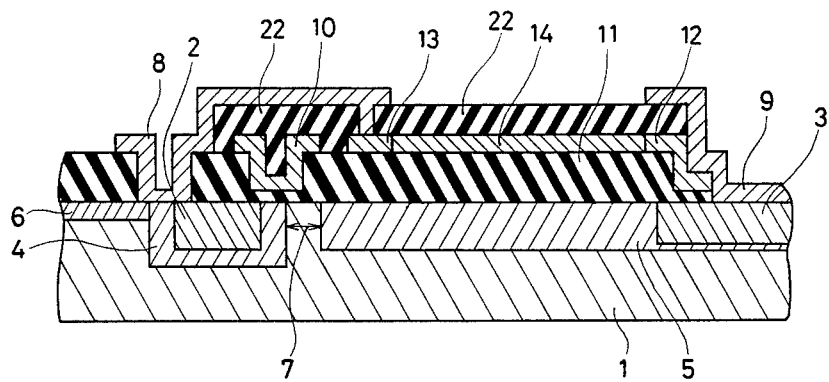
FIG. 1 shows a sectional view of a specific example of a high voltage MOS transistor according to the present invention.

FIG. 1 shows an example of a high voltage MOS transistor according to the present invention. The transistor comprises a P type semiconductor substrate 1, an N+ type source region 2, an N+ type channel drain region 3, a P+ type region 4, an N− type pinch resistance channel region or layer 5, a field dope region 6, a source electrode 8, a drain electrode 9, a gate electrode 10, an insulating layer 11, and a high resistance layer 14.

The P+ type region 4 is formed around the N+ type source region 2 by self alignment techniques. The region 4 is for the purpose of a gate channel of this MOS transistor. The N− type pinch resistance layer or channel region 5 is connected to the N+ type drain region 3. The source electrode 8 is connected to the N+ type source region 2. The drain electrode 9 is coupled to the N+ type drain region 3.

As a feature of the present invention, the high resistance layer 14 is provided for completely or substantially covering the N− type pinch resistance layer 5. One end 12 of this layer 14 is coupled to the drain electrode 9 having an ohmic contact while the other end 13 is connected to the source electrode 8 in ohmic contact. The material of the high resistance layer 14 may be selected to be polycrystalline silicon or a semi-insulating material.

In the case where the resistance value of the high resistance layer 14 is too small, the current between the drain and the source is too large to provide a practical transistor. Therefore, a high resistance value of layer 14 is required.

When each of the electrodes 8 and 9 of the transistor indicated in FIG. 1 receives each of an operating voltage and an input signal, such that there is essentially no variation in the voltage value within the high resistance layer 14 connected to each of the source electrode 8 and the drain electrode 9. Therefore, the pinch resistance layer 5 under the layer 14 is provided with a constant electric field to prevent the influence by external charges so that the stable driving operation of the transistor is assured.

In FIG. 1, the layer 14 is coupled to the source electrode 8 in the ohmic contact. In place of this connection, the layer 14 can be connected to the gate electrode 10 to obtain the same purpose.

The end of the layer 5 not connected to the drain region 3 is separated from the P+ type channel region 4 to provide a separation 7 of P− type. The field dope region 6 which is produced by doping with an impurity to make a P+ type layer, is positioned outside the region 4. The source electrode 8 connected to the region 2 is also connected to the channel region 4 and the field dope region 6.

Improvement in the cut-off of the sustained voltage and in the operating of a sustained voltage by a high voltage bias, so as to sustain an ON voltage, is achieved by the provision of the field dope region 6, the connection between the channel region 4 and the source region 2, and the separated portion 7.

Manufacturing steps for the transistor of FIG. 1 are described in FIGS. 2(a) to 2(f).

FIG. 2(a):

The P type semiconductor substrate 1 has a small density of impurity. A resist 16 is provided for covering parts in which the source region and the channel region are to be formed. Injection of 31 P+ ion is conducted through an oxide film 15 covering the total surface of this substrate 1. This impurity injected is thermally treated to provide diffusion for the purpose of making the N− type pinch resistance layer 5.

Figure 2A:
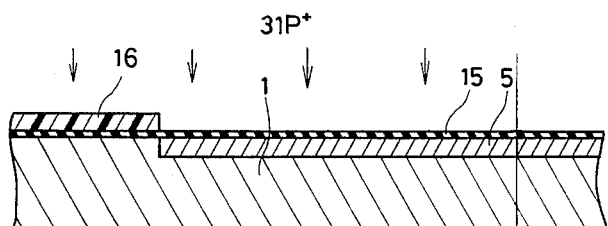
FIGS. 2(a) through 2(f) show manufacturing steps for preparing the transistor of FIG. 1.
Figure 2B:
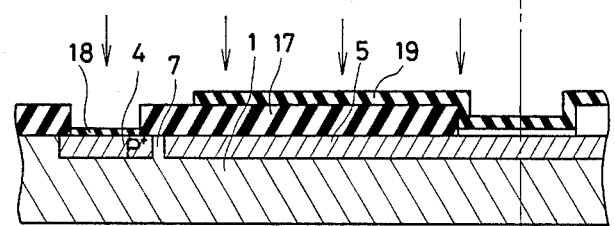
Figure 2C:
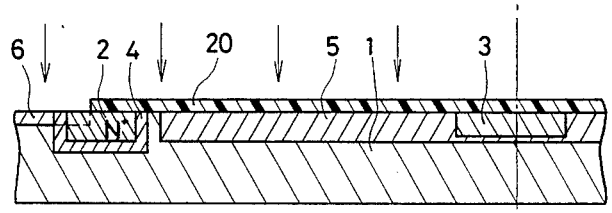
Figure 2D:
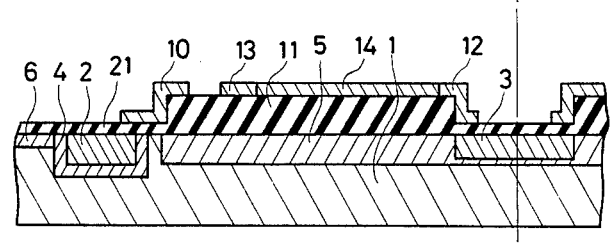
Figure 2E:
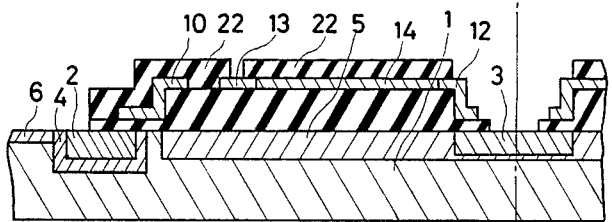
Figure 2F:
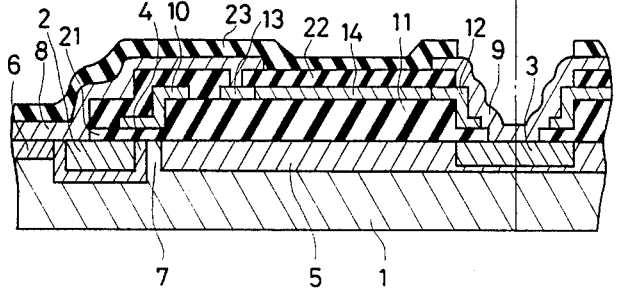

FIG. 2(b):

A thick oxide film 17 is prepared by the thermal treatment in the step of FIG. 2(a). The oxide film 17 is windowed at the source and the drain regions formed by a photo etching technique. A thin oxide film 18 is formed at these regions, thereafter. While a resist 19 partially covers the respective surface, ion injection and diffusion treatment from the surface prepare the P+ type channel region 4. The region 4 is separated from the pinch resistance layer 5 with a separation 7.

FIG. 2(c):

Two N+ type regions are prepared by diffusion or ion injection to provide the source region 2 and the drain region 3. Thereafter, the oxide films 17 and 18 are removed.

A resist layer 20 is partially positioned on the surface. Ion injection is applied to provide the P+ type field dope region 6.

FIG. 2(d):

A thick oxide film 11 is prepared on the surface by using vapor deposition. Parts of this film 11 are removed for the drain, the gate and the source regions. A thin oxide film 21 is formed on these parts. The high resistance layer 14 and the gate electrode 10 of polycrystalline silicon are formed. The gate electrode layer 10 and the layer 14 are subjected to ion injection or the like to produce an appropriate resistance. Then both layers are outlined using etching techniques. The ends 12 and 13 of the high resistance layer 14 are treated by diffusion or ion injection for the purpose of producing a small value of resistance so that they are contacted to the Al material with an ohmic contact.

FIG. 2(e):

Over the entire surface of the substrate 1, a glass film 22 (FIG. 1) made of phosphate silicate glass is formed having a window opposed to each of the ends 13 and 12 of the layer 14, the source region, and the drain region.

FIG. 2(f):

Including the window of the glass film 22, a metal, such as Al, is evaporated onto the source electrode 8 and the drain electrode 9. At the same time, each of the ends 12 and 13 of the layer 14 is connected to each of the source electrode 8 and the drain electrode 9, and if desired, the gate electrode 10. A protecting insulating layer 23 is provided for covering the semiconductor device, whereby the transistor is completed.

Referring to the example of FIG. 1, the N− type pinch resistance layer 5 is provided. According to the present invention the high resistance layer 14 is provided for covering the channel connection, which is indicated by the regions 4, 5, and 7 in FIG. 1. This concept can be applied to other types of transistors in which neither of the pinch resistance layer 5 and/or P+ type channel region 4 are formed,.

Figure 3:
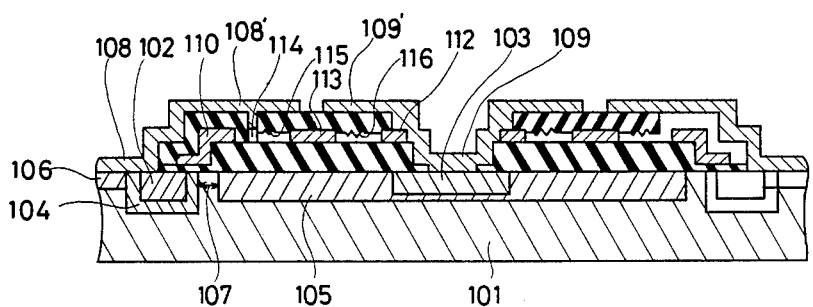
FIG. 3 shows a sectional view of another specific example of the high voltage MOS transistor according to the present invention.

FIG. 3 shows another form of the transistor according to the present invention. This transistor comprises a P type semiconductor substrate 101, an N+ type source region 102, an N+ type drain region 103, a P+ type region 104, an N− type pinch resistance layer 105, a field dope region 106, a source electrode 108, a drain electrode 109, a gate electrode 110, an insulating layer 111, and a conductive material 113.

The conductive material 113 is provided for covering the pinch resistance layer 105 with the insulating layer 111 interposed therebetween. Each of a field plate layer 108' extending from the source electrode 108 and another field plate layer 109' extending from the drain electrode 109 also covers the pinch resistance layer 105. The selected material for the layer 113 may be, Al, MO, or W.

Preferably, direct connection between the layer 113 and each of the field plate layers is prevented. The layer 113 is disposed on a plane different from that of each of the field plate layers. The layer 113 is positioned within an insulating material. To remove the fear that the layer 113 positioned within the insulating material will have an unstable electrical level leading to unstable operations, each of the high resistance materials 115 and 116 is provided for connecting the layer 113 and each of the field plate 108' and the drain electrode 109. Therefore, the level of layer 113, in operation, is set to be in the middle between the level of the source electrode 108 and that of the drain electrode 109.

End portions 112 and 114 are provided for connecting each of the high resistance materials 116 and 115 with each of the drain electrode 109 and field plate 108', respectively. The material of each of the end portions 112 and 114 has a low resistance. The material of each of the layers 115 and 116 may be selected to be polycrystalline silicon or a semiinsulating material for providing an appropriate resistance.

Since the layer 113 is coupled to each of the source electrode 108 and the drain electrode 109 through each of the layers 115 and 116, the electrical level of the layer 113 during operating conditions is fixed to the level which is defined by voltage dividing the drain voltage by the values of the resistance materials 115 and 116.

The end of the pinch resistance layer 105 not connected to the N+ type drain region 103 is separated from the P+ type channel region 104 with a separation 107 of P− type. The field dope region 106 of P+ type is positioned outside the channel region 104. The source electrode 108 is connected to each of the source region 102, the P+ type channel region 104, and the field dope region 106.

Figure 4:
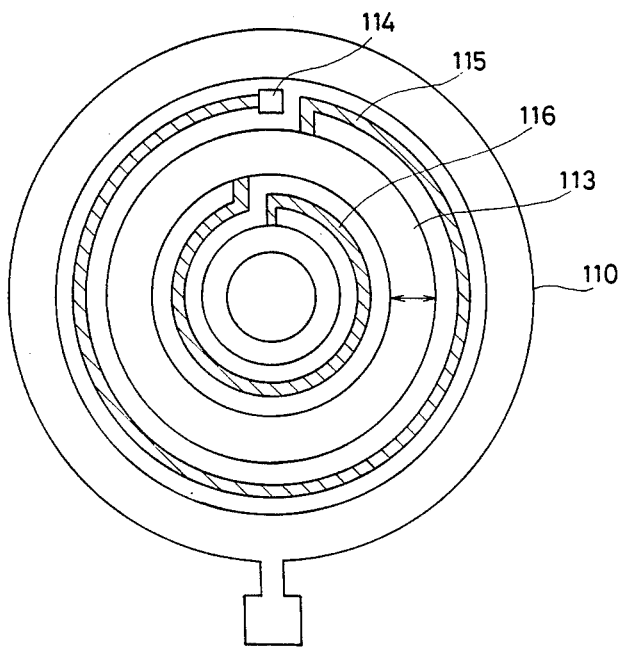
FIG. 4 show a plan view of the transistor as indicated in FIG. 3.

FIG. 4 shows a plan view of a section including the layer 113. Preferably, the length of the layers 115 and 116 is set to be as long as possible for the purpose of maintaining the leak current between the source and the drain as small as possible.

FIGS. 5(a) through 5(f) show the manufacturing steps for preparing the MOS transistor of FIG. 3.

FIG. 5(a):

The P type semiconductor substrate 101 has a small density of impurity. A resist 117 is provided for covering parts in which the source and the channel region are to be formed. Injection of 31 P+ is conducted through a thin oxide film 118 covering the surface. This impurity injected is thermally treated as the step of FIG. 2(a).

Figure 5A:
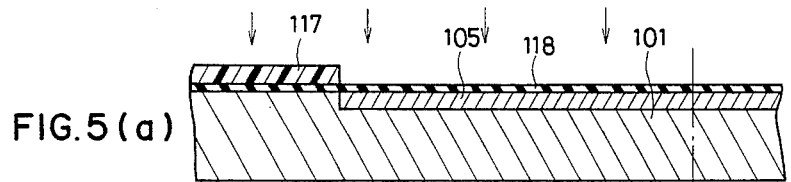
FIGS. 5(a) through 5(f) show manufacturing steps for preparing the transistor of FIG. 3.
Figure 5B:
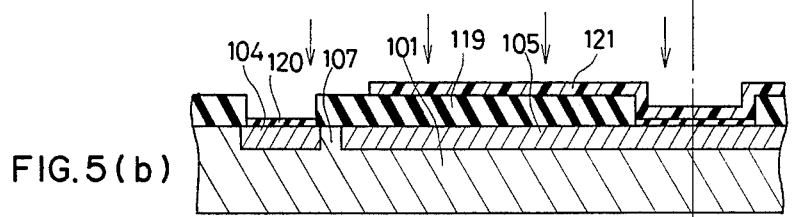
Figure 5C:
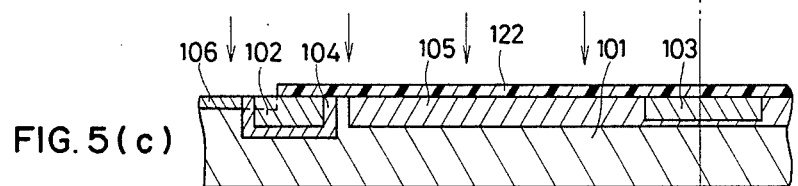
Figure 5D:
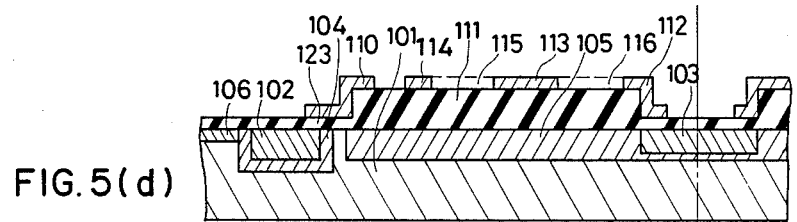
Figure 5E:
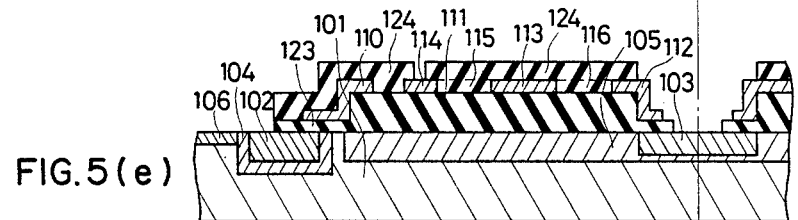
Figure 5F:
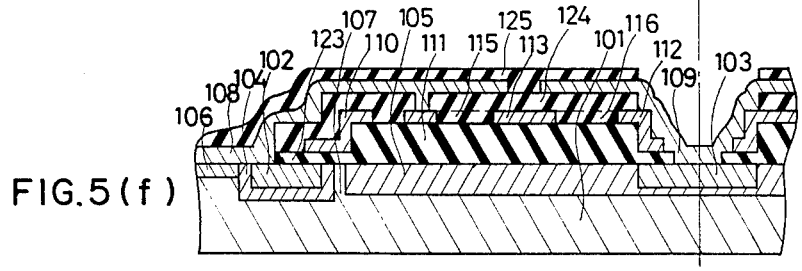

FIG. 5(b):

A thick oxide film 119 is prepared by the above thermal treatment in the step of FIG. 5(a). The oxide film 119 is windowed at the source and the drain regions, formed by photo etching. A thin oxide film 120 is formed at these regions, thereafter. While a resist 121 is partially covering parts of the surface, ion injection and diffusion treatment from the surface are to prepare the P+ type channel region 104. The region 104 is separated from the pinch resistance layer 105 with a separation 107.

FIG. 5(c):

Two N+ type regions are prepared by diffusion or ion injection to provide the source region 102 and the drain region 103. The oxide films 119 and 120 are removed. A resist 122 is partially applied to the surface. Ion injection is conducted to provide the P+ type field dope region 106.

FIG. 5(d):

A thick oxide film 111 is disposed on the surface by using vapor deposition. Parts of this film 111 for the drain, the gate and the source regions are removed. Another thin oxide film 123 is formed on these parts. The gate electrode 110, the conductive layer 113 and the high resistance materials 115 and 116 are formed made of polycrystalline silicon. The polycrystalline silicon layer is subjected to ion injection or the like to provide each with the appropriate resistance values depending on their locations. Unrequired portions of the polycrystalline silicon layer are removed by etching. The ends 112 and 114 of the high resistance elements 115 and 116 are treated by the above resistance-lowering process to provide a small value of resistance so that they are contacted with the ohmic contact.

FIG. 5(e):

Over the entire surface of the thus formed device, a glass film 124 made of phosphate silicate glass is formed having a window opposed to the end portion 114, the source region and the drain regin.

FIG. 5(f):

Including the window of the glass film 124, a metal, such as Al, is evaporated onto the source electrode 108, the drain electrode 109, and the field plate layers. Simultaneously, each of the ends 112 and 114 is coupled to each of the drain electrode 109 and the source electrode 108. Therefore, the electrical level in the material 113 is fixed. Finally, a protecting insulating layer 125 is provided for covering the thus formed semiconductor device for completion.

Figure 6:
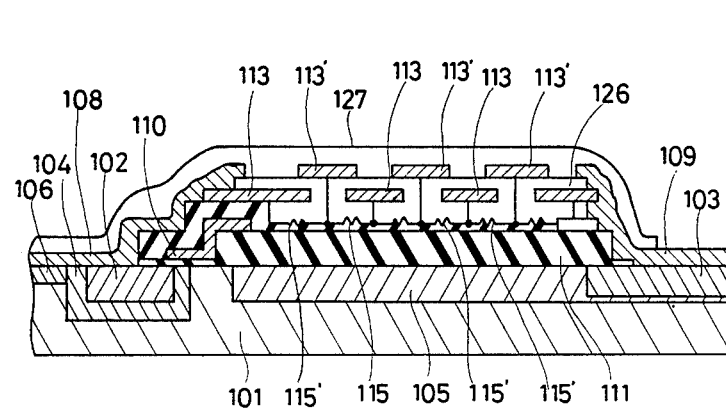
FIGS. 6 and 7 show sectional views of other examples of the transistor according to the present invention.
Figure 7:
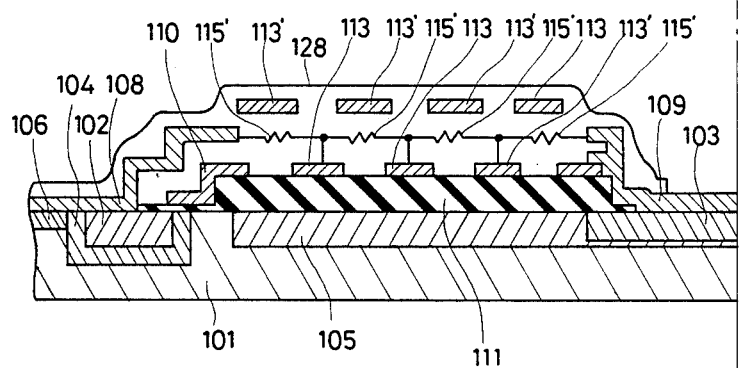

FIGS. 6 and 7 show other examples of the transistor according to the present invention wherein a plurality of conductive elements 113 and 113′ and resistive elements 115′ are provided. In FIG. 6, a second insulating layer 126 contains some elements 113 and a third insulating layer 127 contains some other elements 113′. In FIG. 7, a single insulating layer 128 contains elements 113 and 113′.

While only certain embodiments of the present invention have been described, it will be apparent to those skilled in the art that various changes and modifications may be made therein without departing from the spirit and scope of the invention as claimed.

What is claimed is:

1. A metal oxide semiconductor device of a high voltage type which prevents field concentration near the edge of a gate electrode, eliminates a reverse field plate effect and provides for stable driving operation of said device comprising in cross section:

a semiconductor substrate comprising an upper surface having a conductivity of a first type;

a source region having a conductivity of a second type opposite to that of said semiconductor substrate formed in the surface of said substrate;

a drain region having a conductivity of said second type opposite to that of said semiconductor substrate formed in the surface of said substrate apart from said source region;

a gate channel region having the same conductivity type as said semiconductor substrate connected to said source region within said substrate;

a field dope region positioned adjacent and outside said gate channel region at the surface of said substrate having a conductivity the same as said first type;

a high resistance region of said second type conductivity disposed substantially at the surface of said substrate between said source and drain regions connected to said drain region and separated by a portion of said substrate from said gate channel region;

a continuous insulating layer overlying a portion of said source region, a portion of said gate channel region, said high resistance region and a portion of said drain region;

a drain electrode connected to said drain region having a field plate layer portion extending radially inwardly from said drain electrode;

a source electrode connected to said source region, said gate channel region and said field dope region, having a field plate layer portion extending radially inwardly from said source electrode;

a gate electrode formed above said gate channel region within said continuous insulating layer having a portion of said continuous insulating layer interpositioned between said gate electrode and said substrate; and a high resistance covering layer substantially overlying said high resistance region so as to provide said high resistance region with a constant electric field and to eliminate influence by external charges, said continuous insulating layer being interposed between said high resistance covering layer and said high resistance region, said high resistance covering layer having first and second terminal end portions of low resistance connecting said high resistance covering layer by said first end to said drain electrode and by said second end to said source electrode through said respective radially extending field plate layer portion extension or directly to said gate electrode.

2. The device of claim 1, wherein said high resistance covering layer comprises:

a conductive segment disposed in a plane different from each of said field plate layer portions, respective high resistance materials at either end of said conductive segment, each of said high resistance materials having terminal end portions of low resistance connecting said conductive segment with said drain electrode and field plate layer extension portion of said source electrode, respectively.

3. The device of claim 2, further including at least one additional insulating layer, said insulating layer including at least one of said conductive segments and adjoining resistive materials.

* * * * *